United States Patent
Higgins et al.

(10) Patent No.: US 6,175,936 B1
(45) Date of Patent: Jan. 16, 2001

(54) APPARATUS FOR DETECTING FAULTS IN MULTIPLE COMPUTER MEMORIES

(75) Inventors: Frank P. Higgins, West Trenton; Ilyoung Kim, Plainsboro, both of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/118,295

(22) Filed: Jul. 17, 1998

(51) Int. Cl.[7] .................................................. G11C 29/00
(52) U.S. Cl. ............................................. 714/711; 714/733
(58) Field of Search ................................. 365/200, 201; 714/7, 733, 718, 711; 395/500.05; 438/11

(56) References Cited

U.S. PATENT DOCUMENTS

| | | | |
|---|---|---|---|
| 5,197,030 | * | 3/1993 | Akaogi et al. ........................ 365/200 |
| 5,255,227 | * | 10/1993 | Haeffele .............................. 365/200 |
| 5,410,687 | * | 4/1995 | Fujisaki et al. ...................... 365/201 |
| 5,553,082 | * | 9/1996 | Connor et al. ....................... 714/733 |
| 5,574,688 | | 11/1996 | McClure et al. ..................... 365/200 |
| 5,631,868 | * | 5/1997 | Termullo Jr., et al. .............. 365/200 |
| 5,748,543 | * | 5/1998 | Lee et al. ............................. 365/200 |
| 5,764,878 | * | 6/1998 | Kablanian et al. ...................... 714/7 |
| 5,796,745 | * | 8/1998 | Adams et al. ........................ 714/718 |
| 5,995,731 | * | 11/1999 | Crouch et al. .................. 395/500.05 |
| 6,001,662 | * | 12/1999 | Correale, Jr., et al. ................ 438/11 |
| 6,026,505 | * | 2/2000 | Hedberg et al. ...................... 714/711 |

\* cited by examiner

*Primary Examiner*—Albert De Cady
*Assistant Examiner*—David Ton
(74) *Attorney, Agent, or Firm*—Duane, Morris & Heckscher

(57) ABSTRACT

Memory test hardware is provided for generating signals for testing a first memory array and a second memory array. The first memory array and the second memory array may be any two of main memory array, a spare memory array, and reconfiguration memory array, or the apparatus may be adapted for testing all three memory arrays. The memory test hardware may include a controller for generating control signals, a data generator coupled to the controller for generating data signals, and an address generator coupled to the controller for generating address signals. The test device may further include an output data evaluator and repair unit for receiving signals from the main memory array and the spare memory array and for detecting faults in those arrays.

16 Claims, 4 Drawing Sheets

APPARATUS FOR DETECTING FAULTS IN MULTIPLE COMPUTER MEMORIES

FIELD OF THE INVENTION

This invention relates to computer memories, and in particular to hardware for built-in self-test for embedded memories.

BACKGROUND OF THE INVENTION

Computer memory arrays on chips involve a very large number of individual cells. For dynamic random access memories, the number of cells is very large. As a result, even small defect rates arising out of the manufacturing process result in an unacceptably low yield. Test procedures are applied to DRAM chips, usually on wafer-by-wafer basis. Every chip on each wafer is tested on specialized equipment, which identifies the locations of defective cells. Location information is then supplied to a controller for a laser repair device, which achieves a hardware fix. The repaired wafer is then tested again.

Such test and repair procedures are expensive because of the need to employ specialized test and repair equipment.

In SRAM chips, and other chips with embedded logic, repairs are not ordinarily carried out. The size of arrays in SRAM chips and other such chips has been small enough that, even without repairs, acceptable yield is obtained. Also, because SRAM chips are generally more specialized and manufactured in smaller quantities, the cost of configuring laser repair machines must be averaged over a relatively small number of wafers, when compared to DRAM chips.

In chips with embedded memories, it has become possible to have test procedures carried out by logic on the chip, known as built-in self-test units. The built-in self-test units for SRAM chips carry out a verification process resulting in a simple indication of whether there is a defect in the memory array. As defective chips are simply discarded, no additional information is required.

However, array size in SRAM chips is steadily increasing. Accuracy in manufacturing techniques is not increasing sufficiently rapidly to maintain yields. Furthermore, additional components, which were formerly in separate devices, are also being added to SRAM chips. The added components increase functionality of the chips, and are sometimes referred to as a system on a chip. These devices mean that individual chips are much more expensive, making discarding faulty chips undesirable.

SUMMARY OF THE INVENTION

There may be provided in addition to a main memory array, a spare memory array, and a reconfiguration memory device for mapping from defective cells in the main memory array to designated cells in the spare memory array. According to one aspect of the invention, an apparatus for testing computer memories disposed on a substrate is provided. The apparatus has memory test hardware for generating signals for testing a first memory array and a second memory array. The first memory array and the second memory array may be any two of the main memory array, the spare memory array, and the reconfiguration memory device, or the apparatus may be adapted for testing all three memory arrays. The memory test hardware may include a controller for generating control signals, a data generator coupled to the controller for generating data signals, and an address generator coupled to the controller for generating address signals. The test device may further include an output data evaluator and repair unit for receiving signals from the main memory array and the spare memory array and for detecting faults in those arrays. This configuration permits the testing of multiple memory arrays with a minimum of hardware.

According to another aspect of the invention, a method for testing computer memories disposed on a substrate includes the steps of generating test signals from memory test hardware disposed on the substrate to test a first memory array disposed on the substrate, and generating test signals from the memory test hardware to test a second memory array disposed on the substrate. The memory arrays may include a main memory array, a spare memory array, the memory of a reconfiguration control unit for mapping from defective cells in the main memory array to the spare memory array.

According to another aspect of the invention, a method for testing computer memories located on a substrate includes providing test signals to a first memory array and a second memory array. A single output data evaluator and repair unit receives signals from both the first and second memory arrays, and determines the existence of faults in the first and second memory arrays. The data evaluator and repair unit also determines the location of the faults to the degree of precision required.

DETAILED DESCRIPTION OF A PREFERRED EMBODIMENT

Figure 1:
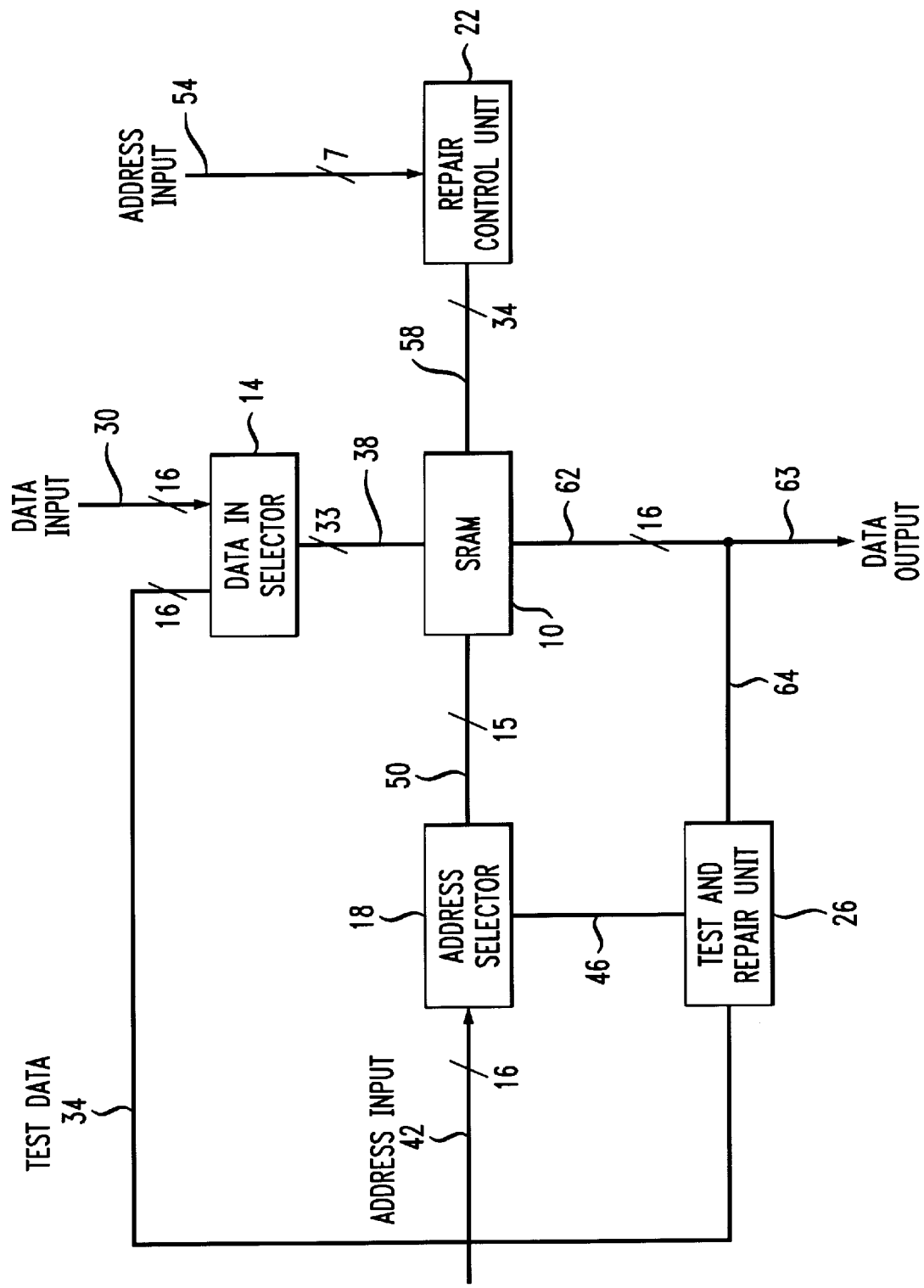
FIG. 1 is a block diagram of a device according to the present invention.

Referring now to FIG. 1, there is shown a high level block diagram of a memory device and associated devices. The components shown on the block diagram are all on a substrate, normally a silicon chip. These components are all components of what is generally referred to as the memory block of a memory device. There is shown a static read only memory (SRAM) 10, a data in selector 14, an address selector 18, a repair control unit 22, and a test and repair unit 26. Data input line 30 couples an input side of data in selector 14 to other devices. Data input line 30 may be, for example, a 16-bit line. Test data line 34 couples an output of test and repair unit 26 to an input side of data in selector 14. Test data line 34 is preferable of the same bandwidth as data input line 30. Memory input line 38 couples an output of data in selector 14 to memory 10. Address input line 42 couples address selector 18 to other devices. Address input line 42 may be a 16-bit line. Test address line 46 couples an output of test and repair unit 26 to address selector 18. Address input line 50 couples an output of address selector 18 to memory 10. Second address input line 54 couples repair control unit 22 to other devices. Second address input line 54 may be a 7-bit line. Repair control unit output line 58 couples an output of repair control unit 22 to memory 10. Data output line 62 couples an output of memory 10 to other devices, through branch 63, and to test and repair unit 26, through branch 64. Data output line 62 may be 16-bit line.

Figure 2:
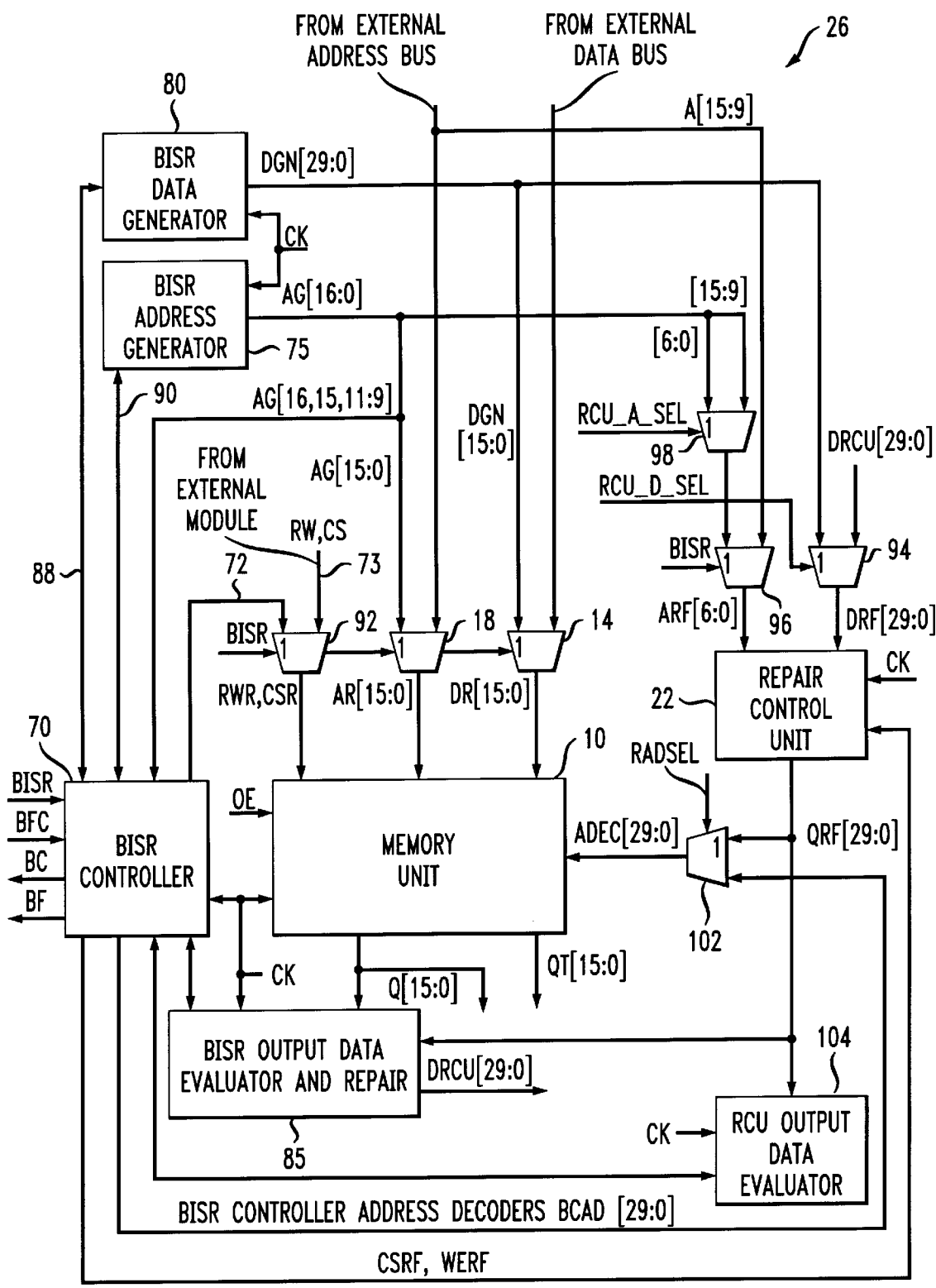
FIG. 2 is a more detailed block diagram of a device according to the present invention.

Referring now to FIG. 2, there is shown a block diagram of test and repair unit 26, which may also be referred to as built-in self-repair (BISR) and self-test unit. Test and repair unit 26 is depicted with various devices surrounding memory unit 10. Test and repair unit 26 is seen to include BISR controller 70, BISR address generator 75, BISR data generator 80, and BISR output data evaluator and repair 85. The components of test and repair unit 26 may also be referred to as memory test hardware. BISR controller 70 is coupled through data line 88 to BISR data generator 80. BISR controller 70 is coupled through data line 90 to BISR address generator 75. BISR controller 70 is coupled through a data line to address selector 18, which is a multiplexor in this embodiment. BISR controller 70 is also coupled to read/write and chip select selector 92. An output of BISR data generator 80 is coupled to repair control unit 22 though multiplexor 94. The output of BISR data generator 80 is also coupled to data in selector 14, which is a multiplexor. An output of BISR address generator 75 is coupled, through multiplexor 96 to reconfiguration control unit 22. Multiplexor 96 selects between signals from BISR address generator 75 and external address signals. Multiplexor 98 is provided intermediate BISR address generator 75 and multiplexor 96. Multiplexor 98 permits testing of both repair control unit 22 and memory unit 10 using addresses output by BISR address generator 75. The output of BISR address generator 75 is also coupled to address selector 18.

Figure 3:
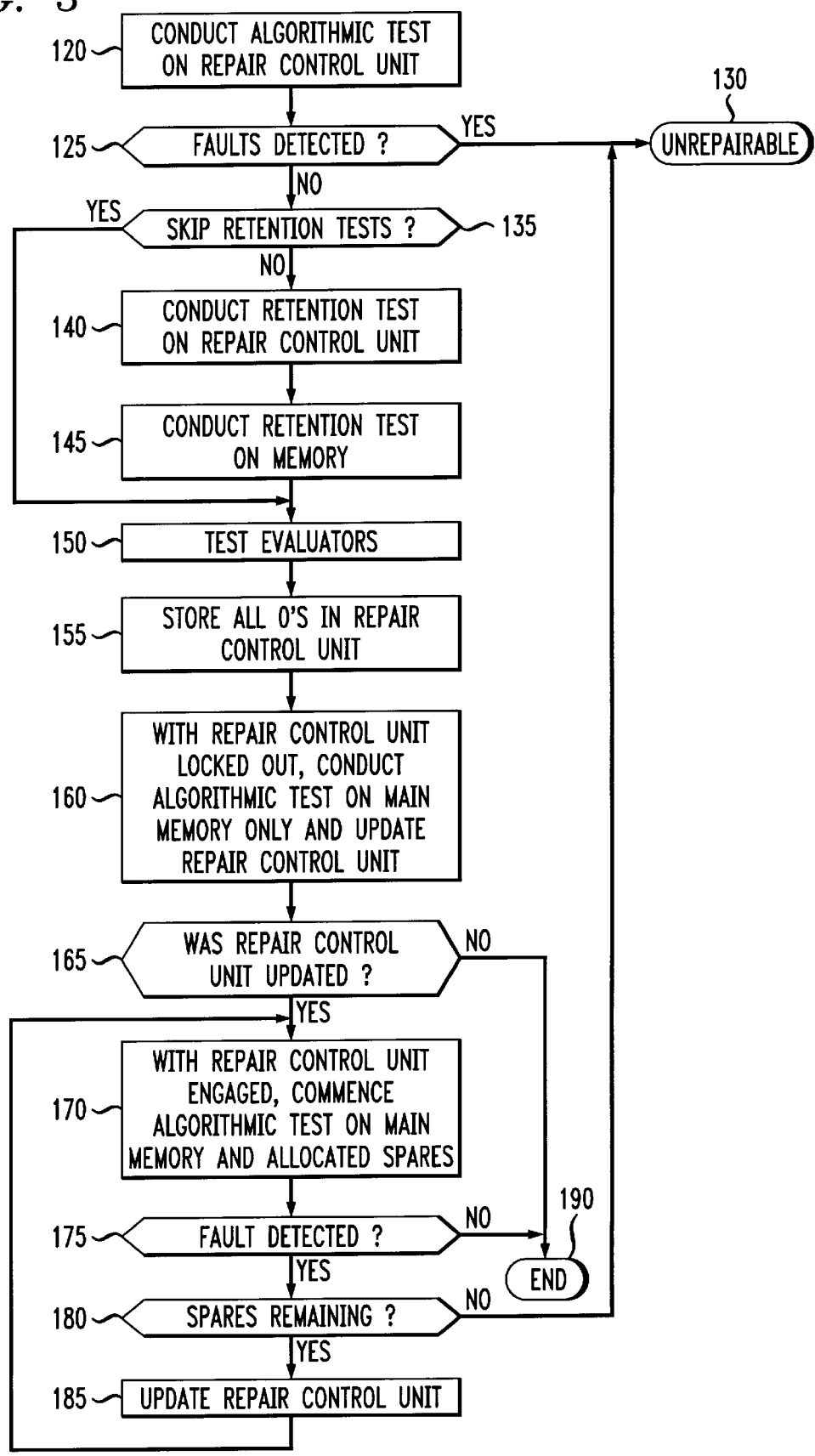
FIG. 3 is a flow diagram showing steps in a method according to the present invention.

Memory unit 10 includes input and output devices as set forth in more detail below with respect to FIG. 3. Read/write and chip select selector 92 is coupled through line 72 to an output of BISR controller 70. Read/write and chip select selector 92 is also coupled, through line 73, to an external source of read/write and chip select signals. It will be understood that BISR controller 70 is adapted to provide on line 72 signals emulating read/write and chip select signals. Address selector 18 is coupled, as noted, to BISR address generator 75, and to an external address bus (not shown). Data in selector 14 is coupled both to an output of BISR data generator 80 and to an external data bus (not shown).

As for the inputs of repair control unit 22, multiplexor 94 is also coupled to an output of BISR output data evaluator and repair 85. Multiplexor 96 is coupled to an external address bus, as is address selector 18. BISR controller 70 is also directly coupled to reconfiguration control unit 22. An output of reconfiguration control unit 22 is coupled to repair address decoder 102, to RCU output data evaluator 104, and to BISR output data evaluator and repair 85.

It will be understood from FIG. 2 and the above description that BISR controller 70 provides the logic for self-repair and self-test device 26.

BISR controller 70 is a suitable programmable device, such as several finite state machines and associated control signals. Microcontrollers could also be employed.

The steps in the testing process will now be described with reference to FIG. 3. The first step is an algorithmic test on repair control unit 22, as shown by block 120 labeled CONDUCT ALGORITHMIC TEST ON REPAIR CONTROL UNIT. This step is carried out by BISR controller 70 providing signals to BISR address generator 75 and BISR data generator 80 to carry out an algorithmic test on repair control unit 22. The algorithmic test consists of alternately writing to and reading from the cells in repair control unit 22 according to a predefined algorithm. The algorithm may be, by way of example, a 17n or 17-step algorithm. An algorithm known as Algorithm B is an example of such an algorithm. RCU output data evaluator 104 receives output data from repair control unit 22 during this test. RCU output data evaluator 104 is designed simply to determine whether or not there are any faults detected during the algorithmic test. BISR controller 70 provides control data to RCU output data evaluator 104. RCU output data evaluator 104 compares data received from repair control unit 22 to control data received from BISR controller 70. RCU output data evaluator 104 then reports the result of the test, i.e., whether or not a discrepancy, and therefore a fault, has been detected, to BISR controller 70. As shown by decision block 125, labeled FAULTS DETECTED?, if faults are detected in repair control unit 22, the conclusion is that the chip is unrepairable, as shown by ending block 130, labeled UNREPAIRABLE. In that event, the test is ended.

If no faults are detected in repair control unit 22, the next step depends on whether the retention tests are to be skipped, as shown by decision block 135, labeled SKIP RETENTION TESTS? Retention tests determine whether data is retained in memory cells over an extended period of time. Retention tests generally involve writing a known pattern to a memory, waiting a preselected period of time, reading the data stored in memory, writing the complement of the known pattern, waiting the preselected period of time again, and reading the data stored in memory. If there is any discrepancy between the data written to the memory in either step and the data read from the memory, the memory is failing to retain data, usually as the result of manufacturing errors. As the preselected period of time is ordinarily measured in minutes or hours, retention tests are only conducted when completely necessary, such as on the initial testing of the chip following manufacturing. In the field, because of the delay in using the memory resulting from the need to wait for the preselected period of time, retention testing is not desirable. Also, retention faults ordinarily arise from manufacturing defects, and do not ordinarily develop in memories after manufacture. Therefore, the value of retention testing in the field is limited. The BFC signal to BISR controller 70 indicates whether or not the retention test is to be skipped. If the retention test is not being skipped, then the next step is to conduct a retention test on repair control unit 22, as shown by block 140, labeled CONDUCT RETENTION TEST ON REPAIR CONTROL UNIT. A retention test is conducted under the control of BISR controller 70 by BISR data generator 80 providing data to repair control unit 22 and BISR address generator 75 providing address information for the data. RCU output data evaluator 104 is used by BISR controller 70 to check for retention test results indicating a retention fault.

If the retention tests are being conducted, the next step is conducting a retention test on memory 10, as shown by block 145, labeled CONDUCT RETENTION TEST ON MEMORY. BISR controller 70 initiates the retention test on memory 10 by providing suitable instructions to BISR address generator 75 and BISR data generator 80. Data is output to BISR output data evaluator and repair 85.

If both retention tests are successful, the testing proceeds to testing of RCU output data evaluator 104 and BISR output data evaluator and repair 85, as shown by block 150, labeled TEST EVALUATORS. As can be seen from FIG. 3, the step of testing of RCU output data evaluator 104 and BISR output data evaluator and repair 85 is also the step immediately following the algorithmic test on repair control unit 22, if the retention tests are not being conducted. A walk and address test is conducted on BISR output data evaluator and repair 85 and RCU output data evaluator 104 by 13 BISR controller 70.

The next step is to initialize repair control unit 22 by storing 0's in all of its memory locations, as shown by block 155, labeled STORE ALL 0'S IN REPAIR CONTROL UNIT. This step is carried out by BISR controller 70 providing suitable instructions to BISR data generator 80 to generate 0's and BISR address generator 75 to designate all memory addresses in repair control unit 22.

After completion of the foregoing step, the next step is the execution of an algorithmic test on main memory only of memory 10 and the updating of repair control unit 22 with data reflecting mapping between defective cells in main memory and corresponding spare cells in one or more spare memories of memory 10. This process is shown by block 160, labeled WITH REPAIR CONTROL UNIT LOCKED OUT, CONDUCT ALGORITHMIC TEST ON MAIN MEMORY ONLY AND UPDATE REPAIR CONTROL UNIT. This step is explained in detail below with reference to FIG. 4. During this step, BISR controller 70 provides control signals to BISR address generator 75 and BISR data generator 80 to perform an algorithmic test on the main memory 10. BISR output data evaluator and repair 85 evaluates the data received from memory 10. BISR output data evaluator and repair 85 sends a signal to BISR controller 70 indicating whether or not the data is faulty. The information as to whether or not the output data is faulty is employed by the algorithm to decide the next step. If the output data, as indicated by the signal from BISR output data evaluator and repair 85 is not faulty, then there is no need to update repair control unit 22, and the algorithm proceeds to the next address. If the output data is faulty, then the algorithm proceeds to a repair branch, discussed in detail below with reference to FIG. 4. During this testing step, repair control unit 22 is locked out. This is accomplished by BISR controller 70 sending a suitable signal to address multiplexor 98. As a result, the testing is carried out proceeding through the entire main memory. Any allocations of spare memory cells are disregarded during this step. No testing is carried out on the spare memory block or blocks in memory 10.

During the foregoing step, the chip may be declared unrepairable for a variety of reasons, as discussed in more detail below with reference to FIG. 4. In that event, the testing process is stopped. If the foregoing step of algorithmic testing of the main memory and allocation of spares is completed, the next step is to determine whether repair control unit 22 has been updated. This is shown in FIG. 3 by decision block 165, labeled WAS REPAIR CONTROL UNIT UPDATED? If repair control unit 22 was not updated, then the testing is completed, as shown by the line marked NO leading from block 160 to block 190, labeled END.

If repair control unit 22 was updated, then the next step is to commence conducting an algorithmic test of memory 10 with repair control unit 22 activated. BISR controller 70 causes BISR data generator 80 and BISR address generator 75 to conduct an algorithmic test on memory 10. During this step, an appropriate signal is provided by BISR controller 70 to multiplexor 98 so that repair control unit 22 is activated. The same algorithmic test as is conducted on the main memory is preferably used. This step is indicated in FIG. 3 by block 170, labeled WITH REPAIR CONTROL UNIT ENGAGED, COMMENCE ALGORITHMIC TEST ON MAIN MEMORY AND ALLOCATED SPARES. As this test proceeds, faults may be detected in cells in the spare memory blocks. As will be recalled, no general test of the cells of the spare memory blocks is conducted. As many of the cells in a spare memory block are not allocated and therefore not used, the test procedure would be unnecessarily prolonged by testing every cell in the spare memory blocks.

During this step, if no faults are detected, the test is at an end. This is indicated by decision block 175, labeled FAULT DETECTED?, and the line labeled NO leading from decision block 175 to block 190, labeled END. If any faults are detected, new spare cells will be required. Accordingly, the algorithm determines if any new spare cells are available, as indicated by decision block 180, labeled SPARES REMAINING? If no spares are available, the algorithm determines that the chip is unrepairable, as indicated by the line labeled NO leading from block 180 to block 130, labeled UNREPAIRABLE. If spares are remaining, new spare cells are allocated to replace cells in the spare memory array that are found to have faults. If the allocation algorithm identifies an available new spare cell, then repair control unit 22 is updated, and the algorithmic test is restarted. This is indicated in FIG. 3 by block 185, labeled UPDATE REPAIR CONTROL UNIT. The process then returns to conducting the algorithmic test on the main memory and the allocated spares with the repair control unit engaged, as indicated by the line leading from block 185 to block 170. This process continues until the entire memory array is tested, with the repair control unit engaged, thereby testing allocated spare cells, and no faults are found. Alternatively, the process ends when the allocation algorithm determines that no spare cells are available. The test process is then concluded. BISR controller 70 then provides a signal indicating whether the memory chip is usable.

Figure 4:
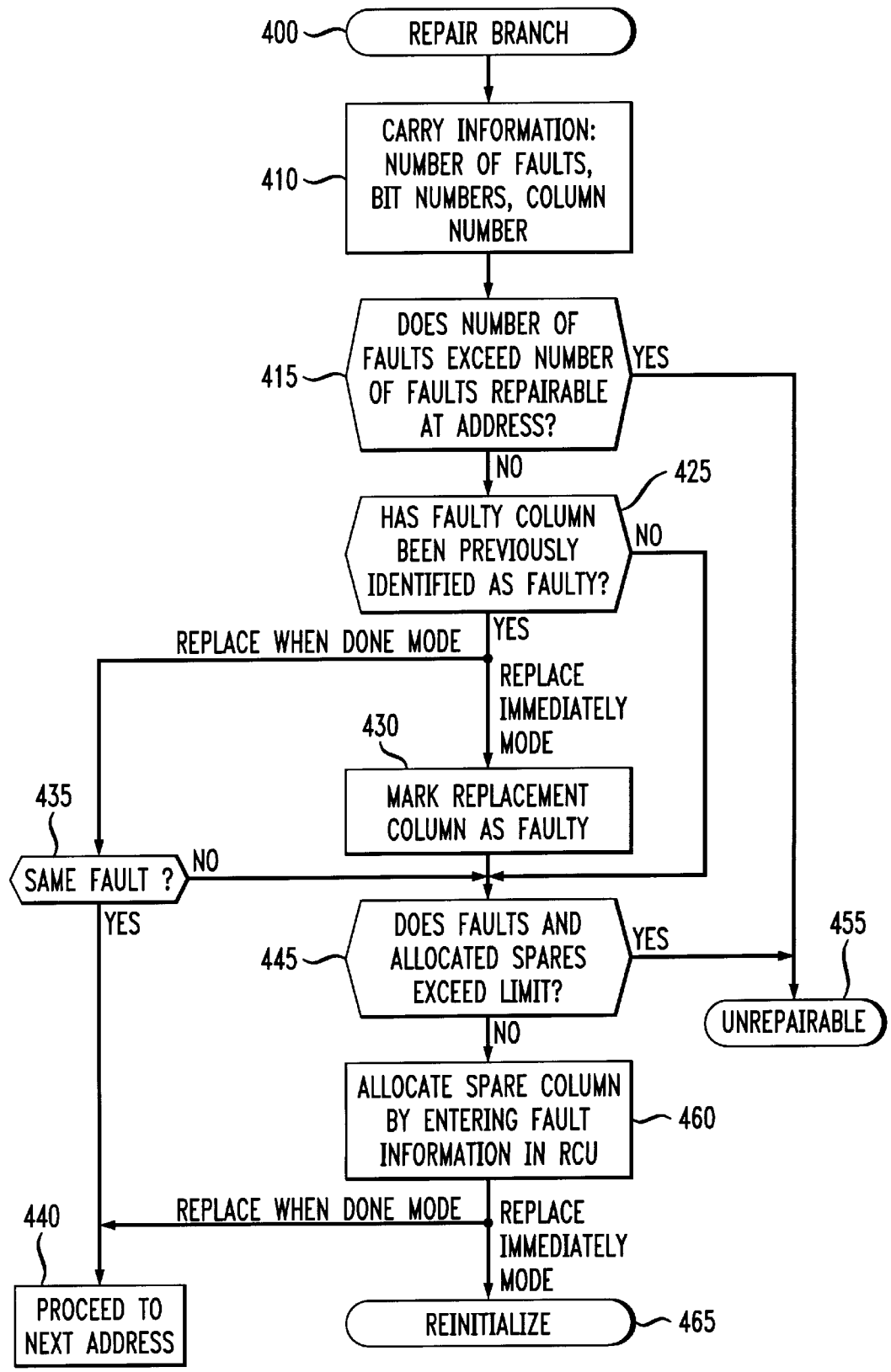
FIG. 4 is a flow diagram showing steps in a method according to the present invention.

Referring now to FIG. 4, the allocation algorithm will be explained in greater detail. The algorithm set forth in FIG. 4 is carried out by BISR controller 70. The algorithm has generally two functions. The first function is to determine whether or not a spare component is available. The second function, invoked after the first function determines that a spare component is available, is the allocation of a spare component in the spare memory block. As part of the process, the address of the faulty component, and the address of the allocated spare component, are stored in suitable association with one another in repair control unit 22. In FIG. 4, block 400, labeled REPAIR BRANCH, indicates the commencement of the repair process. The repair process commences after completion of the algorithmic test. The algorithmic test is carried out on an address-by-address basis. The infonnation identified by the algorithmic test is carried. The algorithm is capable of identifying the location of the fault to the degree of detail desired. For example, if spares are allocated on a cell-by-cell basis, the algorithm must be capable of specifying the address of the faulty cell. If spares are allocated on a bit-by-bit basis, then the algorithm need only specify the bit and column that contains the fault. In block 410, the information is the number of faults, and the bit and column numbers of the faults. The algorithm then determines whether the number of faults exceeds the number of faults repairable at the address, as indicated by block 415. For example, the algorithm may be configured to relate to a main memory block that is divided into a number of sub-blocks, and in which the number of faulty bits in each word that can be replaced in each sub-block is equal to the number of spare memory blocks. This may alternatively be stated as no more than one bit in each spare memory block may be assigned to any one main memory sub-block.

A line marked YES leads from block 415 to block 455, labeled UNREPAIRABLE. This If the number of faults exceeds the number of faults repairable at the address, the fault is unrepairable.

If the number of faults does not exceed the number of faults repairable at the address, then the next step is to determine whether the available spares have already been allocated in repair control unit 22. To do this, in this configuration, BISR controller 70 sends suitable signals to repair control unit 22 to look up the bits that designate the column in question. This step is indicated by block 425, labeled HAS FAULTY COLUMN BEEN PREVIOUSLY IDENTIFIED AS FAULTY?. In this step, the algorithm determines only whether the 7-bit addresses are the same.

If the faulty column has been previously identified as faulty, the next step depends on whether the algorithm is in replace when done mode, or replace immediately mode. Replace when done mode refers to the process conducted with repair control unit 22 locked out. Replace immediately mode refers to the process conducted with repair control unit 22 engaged. In replace immediately mode, the replacement column is marked as faulty, as indicated by block 430. In replace when done mode, the algorithm determines whether the newly identified fault is the same as the previously-identified fault, i.e., whether the previously identified fault and the newly-identified fault are in the same sub-block. This step is illustrated in FIG. 4 by block 435, labeled SAME FAULTS? If the faults are in the same sublock, then a fault that was previously corrected by assignment of a corresponding spare address has been detected. As indicated by the line labeled YES leading from block 435 to block 440, labeled PROCEED TO NEXT ADDRESS, if this is the case, then the repair branch is completed. The test algorithm will then proceed to the next address in sequence.

In the event that the faulty column was not previously identified as faulty, or if the algorithm is in replace immediately mode, or if the algorithm is in replace when done mode and the newly-identified fault is different from the previously-identified fault, the next step is to determine whether the number of faults and allocated spares exceed the limit of available spares. This is indicated by block 445. If the number of faults and allocated spares exceeds the limit of available spares, the fault is unrepairable, as indicated by the line marked YES leading from decision block 445 to block 455. If the number of faults and allocated spares does not exceed the limit, then the algorithm proceeds to the step of allocating spares, and entering the fault and spare information into repair control unit 22, as indicated by block 460.

Allocation of spares is carried out by simply finding the next available column in the appropriate spare memory block. Preferably, spares are allocated on a rotation basis through the spare memory blocks so that the number of allocated spare columns is approximately the same in all spare memory blocks.

When allocation and entering of the information is completed, the next step depends on whether the algorithm is in replace when done mode or replace immediately mode. In replace immediately mode, the entire memory, including the spares, is retested immediately. Accordingly, as indicated by block 465, the process is reinitialized. In replace when done mode, the process proceeds to block 440, labeled PROCEED TO NEXT ADDRESS. This indicates that the repair branch is complete and the testing algorithm proceeds to the next address.

As may be appreciated, the foregoing methods and devices provide for testing multiple separate memory arrays on a chip using the same test hardware. The controller, address generator, and data generator are the same for main memory, spare memory, and the repair control unit. This results in savings in manufacturing complexity and cost.

It will be understood that various changes in the details, materials and arrangements of the parts which have been described and illustrated above in order to explain the nature of this invention may be made by those skilled in the art without departing from the principle and scope of the invention as recited in the following claims.

What is claimed is:

1. A method for testing computer memories disposed on a substrate, comprising tie steps of:

(a) generating test signals from memory test hardware disposed on said substrate to test a reconfiguration memory for mapping defective cells in a main memory array of a memory unit disposed in the substrate to replacement cells in a spare memory array of the memory unit;

(b) if no faults are detected in the reconfiguration memory, then: initializing the reconfiguration memory, generating test signals from the memory test hardware to test the main memory array while the reconfiguration memory is locked out, and updating the locked-out reconfiguration memory to allocate replacement cells of the spare memory to replace any defective cells detected in the main memory array; and (c) if the reconfiguration memory was updated during step (b), then: with the reconfiguration memory engaged, generating test signals from the memory test hardware to test the main memory array and replacement cells of the spare memory army allocated by the reconfiguration memory and updating the reconfiguration memory to allocate new replacement cells of the spare memory to replace any defective replacement cells detected in the spare memory array.

2. The method of claim 1, flier comprising the steps of:

(d) using an output data evaluator and repair unit to test said memory arrays in accordance with said test signals; and (e) using a reconfiguration memory output data evaluator to test said reconfiguration memory in accordance with said test signals.

3. The method of claim 2, wherein step (d) comprises the steps of:

receiving at the output data evaluator and repair unit output signals from said memory arrays in response to said test signals; and determining at said output data evaluator and repair unit the existence of faults in said memory arrays in accordance with said output signals.

4. The method of claim 3, further comprising the step of determining at said output data evaluator and repair unit the location of said faults in said main memory array.

5. The method of claim 1, further comprising the step of repeating the testing and updating of step (c) until either no defective cells are detected or there are no spare cells available.

6. The method of claim 1, wherein said memory test hardware comprises a controller, and address generator, and a data generator.

7. Apparatus for testing computer memories disposed on a substrate, comprising:

(a) a reconfiguration memory for mapping defective cells in a main memory array of a memory unit disposed in the substrate to replacement cells in a spare memory array of the memory unit; and (b) memory test hardware disposed on said substrate for:

(1) generating test signals to test the reconfiguration memory;

(2) if no faults are detected in the reconfiguration memory, then: initializing the reconfiguration memory, generating test signals to test the main memory array while the reconfiguration memory is locked out, and updating the locked-out reconfiguration memory allocate replacement cells of the spare memory to replace any defective cells detected in the main memory array; and (3) if the reconfiguration memory was updated during the Test of the main memory array while the reconfiguration memory is locked out, then: with the reconfiguration memory engaged, generating test signals to test the main memory array and replacement cells of the spare memory array allocated by the reconfiguration memory and updating the reconfiguration memory to allocate new replacement cells of the spare memory to replace any defective replacement cells detected in the spare memory array.

8. The apparatus of claim 7, wherein said memory test hardware comprises a controller for generating control signals, a data generator coupled to said controller for generating data signals, and an address generator coupled to said controller for generating address signals.

9. The apparatus of claim 7, further comprising an output data evaluator and repair unit for receiving output signals from said memory arrays in response to said test signals and for detecting faults in said memory arrays in accordance with said output signals.

10. The apparatus of claim 9, wherein the output data evaluator and repair unit is further for determining the location of said faults in said main memory array.

11. The apparatus of claim 7, wherein the memory test hardware repeatedly tests the main memory array with the reconfiguration memory engaged until either no defective cells are detected or there are no spare cells available.

12. A method for testing computer memories disposed on a substrate, comprising the steps of:

(a) generating test signals from memory test hardware disposed on said substrate to test a reconfiguration memory for mapping defective cells in a main memory array of a memory unit disposed in the substrate to replacement cells in a spare memory array of the memory unit;

(b) generating test signals from said memory test hardware to test the main memory array and updating the reconfiguration memory to allocate replacement cells of the spare memory to replace any defective cells detected in the main memory array; and (c) generating test signals from said memory test hardware to test the main memory array and replacement cells of the spare memory array allocated by the reconfiguration memory.

13. The method of claim 12, further comprising the steps of:

(d) using an output data evaluator and repair unit to test said memory arrays in accordance with said test signals; and (e) using a reconfiguration memory output data evaluator to test said reconfiguration memory in accordance with said test signals.

14. The method of claim 13, wherein step (d) comprises the steps of:

receiving at the output data evaluator and repair unit output signals from said memory arrays in response to said test signals; and determining at said output data evaluator and repair unit the existence of faults in said memory arrays in accordance with said output signals.

15. The method of claim 14, furter comprising the step of determining at said output data evaluator and repair unit the location of said faults in said main memory array.

16. The method of claim 12, wherein said memory test hardware comprises a controller, and address generator, and a data generator.

* * * * *